United States Patent
Li et al.

(10) Patent No.: US 8,710,932 B2
(45) Date of Patent: Apr. 29, 2014

(54) SIGNAL PROCESSING DEVICE AND METHOD FOR PROVIDING OSCILLATING SIGNAL IN THE SIGNAL PROCESSING DEVICE

(75) Inventors: Hao-Jung Li, Hsinchu County (TW); Tung-Yi Wang, New Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 128 days.

(21) Appl. No.: 13/361,955

(22) Filed: Jan. 31, 2012

(65) Prior Publication Data
US 2012/0262245 A1  Oct. 18, 2012

Related U.S. Application Data

(60) Provisional application No. 61/476,429, filed on Apr. 18, 2011.

(51) Int. Cl.
*G06F 1/04* (2006.01)
*G06F 1/08* (2006.01)
*G06F 1/14* (2006.01)

(52) U.S. Cl.
USPC ............ 331/74; 331/59; 331/108 C; 713/500; 327/291

(58) Field of Classification Search
USPC ................. 331/74, 46, 49, 108 D, 108 C, 59; 327/291; 713/500
See application file for complete search history.

(56) References Cited

U.S. PATENT DOCUMENTS

| | | | | |
|---|---|---|---|---|
| 5,663,687 A | * | 9/1997 | Kozu | 331/14 |
| 6,157,265 A | * | 12/2000 | Hanjani | 331/49 |
| 6,948,098 B2 | * | 9/2005 | Pillay et al. | 714/34 |
| 7,714,674 B2 | * | 5/2010 | Guo et al. | 331/176 |

OTHER PUBLICATIONS

NXP, "LPC1768/66/65/64: 32-bit ARM Cortex-M3 microcontroller product data sheet", Rev. 02, Feb. 11, 2009.*

* cited by examiner

*Primary Examiner* — Ryan Johnson
(74) *Attorney, Agent, or Firm* — Winston Hsu; Scott Margo

(57) ABSTRACT

A signal processing device includes a signal processing chip and a conducting path. The signal processing chip includes: a first port capable of receiving a first oscillating signal; a second port capable of outputting a second oscillating signal derived from the first oscillating signal; and a third port. The conducting path is external to the signal processing chip and coupled to the second port and the third port, and the conducting path is capable of transmitting the second oscillating signal outputted from the second port to the third port.

16 Claims, 2 Drawing Sheets

SIGNAL PROCESSING DEVICE AND METHOD FOR PROVIDING OSCILLATING SIGNAL IN THE SIGNAL PROCESSING DEVICE

CROSS REFERENCE TO RELATED APPLICATIONS

This application claims the benefit of U.S. Provisional Application No. 61/476,429, which was filed on 2011 Apr. 18 and is included herein by reference.

BACKGROUND

The present invention relates to a signal processing device and a method for providing an oscillating signal in the signal processing device, and more particularly to a signal processing device that uses fewer oscillators, and a related method.

In a mobile system, a baseband chip can be utilized for performing various kinds of baseband coding/decoding operations, such as audio or video signal processing. In such a system, a precise clock signal should be given to the baseband chip to generate reference clock signals for the functional circuit blocks in the baseband chip. More specifically, an analog RTC (Real-time-clock) block is capable of receiving the precise clock signal, and generating the reference clock signals for the functional circuit blocks in the baseband chip. Conventionally, the precise clock signal is generated by a crystal oscillator external to the baseband chip and the analog RTC block as the crystal oscillator has a relatively stable electrical characteristic. The price of the crystal oscillator can be a problem when dealing with the BOM (Bill of Materials) cost of the mobile system, however. Therefore, how to generate a reference clock signal for the baseband chip while saving the cost of the mobile system has become a problem in this field.

SUMMARY

One of the objectives of the present embodiment is to provide a signal processing device that does not use a crystal oscillator, and a related method.

According to a first embodiment, a signal processing device is disclosed. The signal processing device comprises a signal processing chip and a conducting path. The signal processing chip comprises a first port, a second port, and a third port. The first port is capable of receiving a first oscillating signal. The second port is capable of outputting a second oscillating signal derived from the first oscillating signal. The conducting path is external to the signal processing chip and is coupled to the second port and the third port. The conducting path is capable of transmitting the second oscillating signal outputted from the second port to the third port.

According to a second embodiment, a method for providing an oscillating signal in a signal processing device signal processing device is disclosed. The method comprises: receiving a first oscillating signal by a first port of a signal processing chip; outputting a second oscillating signal derived from the first oscillating signal by a second port of the signal processing chip; and providing a conducting path coupled to the second port and the third port to transmit the second oscillating signal outputted from the second port to the third port, wherein the conducting path is externally coupled to the signal processing chip.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
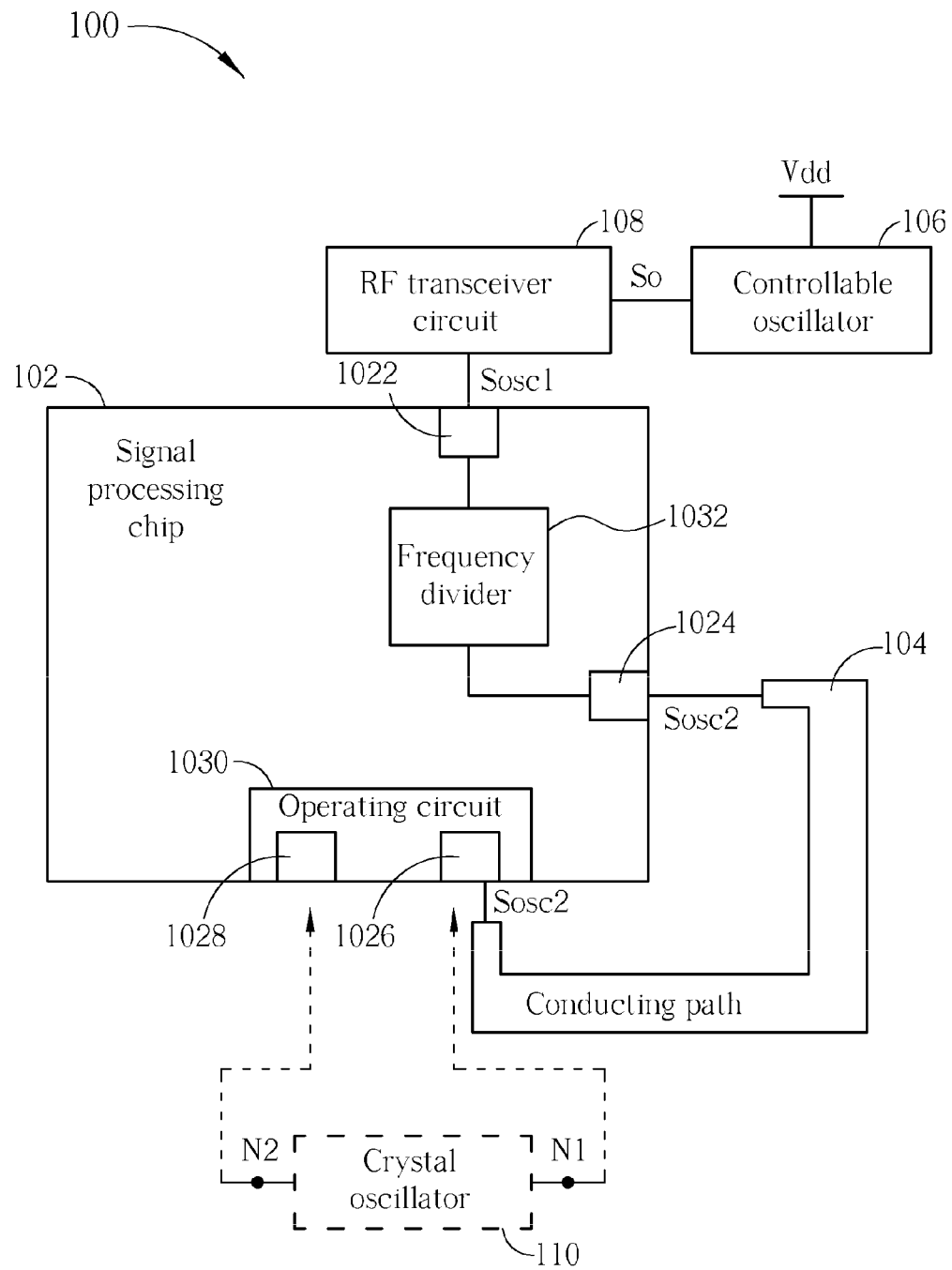
FIG. 1 is a diagram illustrating a signal processing device according to a first embodiment of the present invention.

Please refer to FIG. 1. FIG. 1 is a diagram illustrating a signal processing device 100 according to an embodiment of the present invention. The signal processing device 100 may include a signal processing chip 102, a conducting path 104, and a controllable oscillator 106. The signal processing chip 102 can be utilized for performing various kinds of signal processing, for example, baseband coding/decoding operations such as audio or video signal coding/decoding. The signal processing chip 102 may include a first port 1022, a second port 1024, a third port 1026. In some embodiments, the signal processing chip 102 may further include a fourth port 1028, an operating circuit 1030, and a frequency divider 1032. The controllable oscillator 106 can be coupled to the first port 1022 and is capable of providing a first oscillating signal Sosc1. The first oscillating signal Sosc1 can be provided by the controllable oscillator 106 according to a supply voltage Vdd, which means that the controllable oscillator 106 is not a crystal oscillator. Those skilled in the art should understand that a crystal oscillator is a self-oscillating device which does not need a supply power. The present controllable oscillator 106 may be, for example, a voltage-controlled oscillator (VCO), a voltage-controlled crystal oscillator (VCXO), a temperature-compensated crystal oscillator (TCXO) or a voltage-controlled temperature-compensated crystal oscillator (VCTCXO), etc.

In this preferred embodiment, the oscillating signal (i.e., So) generated/provided by the controllable oscillator 106 can first be input to a radio-frequency (RF) transceiver circuit 108, and the first oscillating signal Sosc1 can then be provided from the RF transceiver circuit 108 and input to the signal processing chip 102. The RF transceiver circuit 108 may be located between the signal processing chip 102 and the controllable oscillator 106 on a circuit board. With the RF transceiver circuit 108, the signal processing chip 102 may be blocked from the interference signal generated by the controllable oscillator 106. It should be noted that, in this embodiment, the frequency of the oscillating signal So is substantially equal to the frequency of the first oscillating signal Sosc1, but this is not a limitation of the present invention. Furthermore, the oscillating signal So generated/provided by the controllable oscillator 106 can also be directly input into the signal processing chip 102 to be the first oscillating signal Sosc1 if the controllable oscillator 106 is located close enough to the signal processing chip 102 on a circuit board and then the interference signal generated by the controllable oscillator 106 may not be a serious issue for the signal processing chip 102.

The first port 1022 is capable of receiving the first oscillating signal Sosc1. The frequency divider 1032, which may be a phase-locked loop (PLL) and can be coupled between the first port 1022 and the second port 1024, is capable of dividing the first oscillating signal Sosc1 to generate/provide a second oscillating signal Sosc2. The second port 1024 is capable of outputting the second oscillating signal Sosc2. The conducting path 104, which can be external to the signal processing chip 102 and coupled to the second port 1024 and the third port 1026, is capable of transmitting the second oscillating signal Sosc2 output from the second port 1024 to the third port 1026.

The operating circuit 1030 is coupled to the third port 1026, and the operating circuit 1030 is capable of receiving the second oscillating signal Sosc2 via the third port 1026 and using the received second oscillating signal Sosc2 as a real-time clock of the signal processing device 100. In other words, the operating circuit 1030 can receive the second oscillating signal Sosc2 to generate/provide reference clock signal(s) for the functional circuit block(s) in the signal processing chip 102 or the signal processing device 100. Furthermore, the operating circuit 1030 can include an analog RTC (Real-time-clock) block capable of receiving the second oscillating signal Sosc2 as a real-time-clock for counting the time of a mobile system including the signal processing device 100. It should be noted that the fourth port 1028 can also be coupled to the operating circuit 1030, wherein the third port 1026 and the fourth port 1028 can form a crystal oscillator input port, and the fourth port 1028 can be unused when the signal processing device 100 is under an operation mode. For example, the fourth port 1028 may be left as an open circuit when the signal processing device 100 is under the operation mode.

Please refer to FIG. 1 again. A conventional mobile system may include a conventional crystal oscillator 110 having two output terminals N1, N2: one is required to couple to the third port 1026 and the other is required to couple to the fourth port 1028, i.e. the dashed line in FIG. 1. In this preferred embodiment, the conventional crystal oscillator 110 is omitted, and the real-time clock is now generated/provided by the controllable oscillator 106. Therefore, the third port 1026 is coupled to the conducting path 104 for receiving the second oscillating signal Sosc2 to be the real-time clock, and the fourth port 1028 can be left unused or simply as an open circuit.

In some embodiments, the controllable oscillator 106 can be arranged to generate/provide the oscillating signal for the RF transceiver circuit 108, then the frequency (e.g., 26 MHz, 13 MHz, etc.) of the first oscillating signal Sosc1 may be higher than the required frequency (e.g., 32.768 KHz, etc.) of the operation circuit 1030. Therefore, the frequency divider 1032 can further be provided to perform a frequency dividing operation upon the first oscillating signal Sosc1 with an oscillating frequency substantially equal to, for example, 26 MHz, to generate/provide the second oscillating signal Sosc2 with an oscillating frequency substantially equal to, for example, 32.768 KHz. When the second oscillating signal Sosc2 is generated/provided in the signal processing chip 102, the second oscillating signal Sosc2 can further be output from the signal processing chip 102 via the second port 1024, and then be again input to the operation circuit 1030 of the signal processing chip 102 via the conducting path 104 and the third port 1026. This is because, except for the operation circuit 1030, the signal processing chip 102 may be a digital circuit, and there may not be a conducting path provided for an oscillating signal, i.e. the second oscillating signal Sosc2, in the digital circuit to transmit to the operating circuit 1030 internally. In other words, the operating circuit 1030 may only recognize the real-time-clock input from the third port 1026 or the fourth port 1028. It should be noted that, the second port 1024 may be implemented by a general purpose input/output (GPIO) pin, which is easy to be generated/provided when designing the signal processing chip 102.

According to the above-mentioned arrangement, the BOM (Bill of Materials) cost of the mobile system can be reduced since the conventional crystal oscillator 110 can be omitted. Meanwhile, the area of printed circuit board (PCB) required by the signal processing device 100 can also be reduced due to the lack of the conventional crystal oscillator 110.

Figure 2:
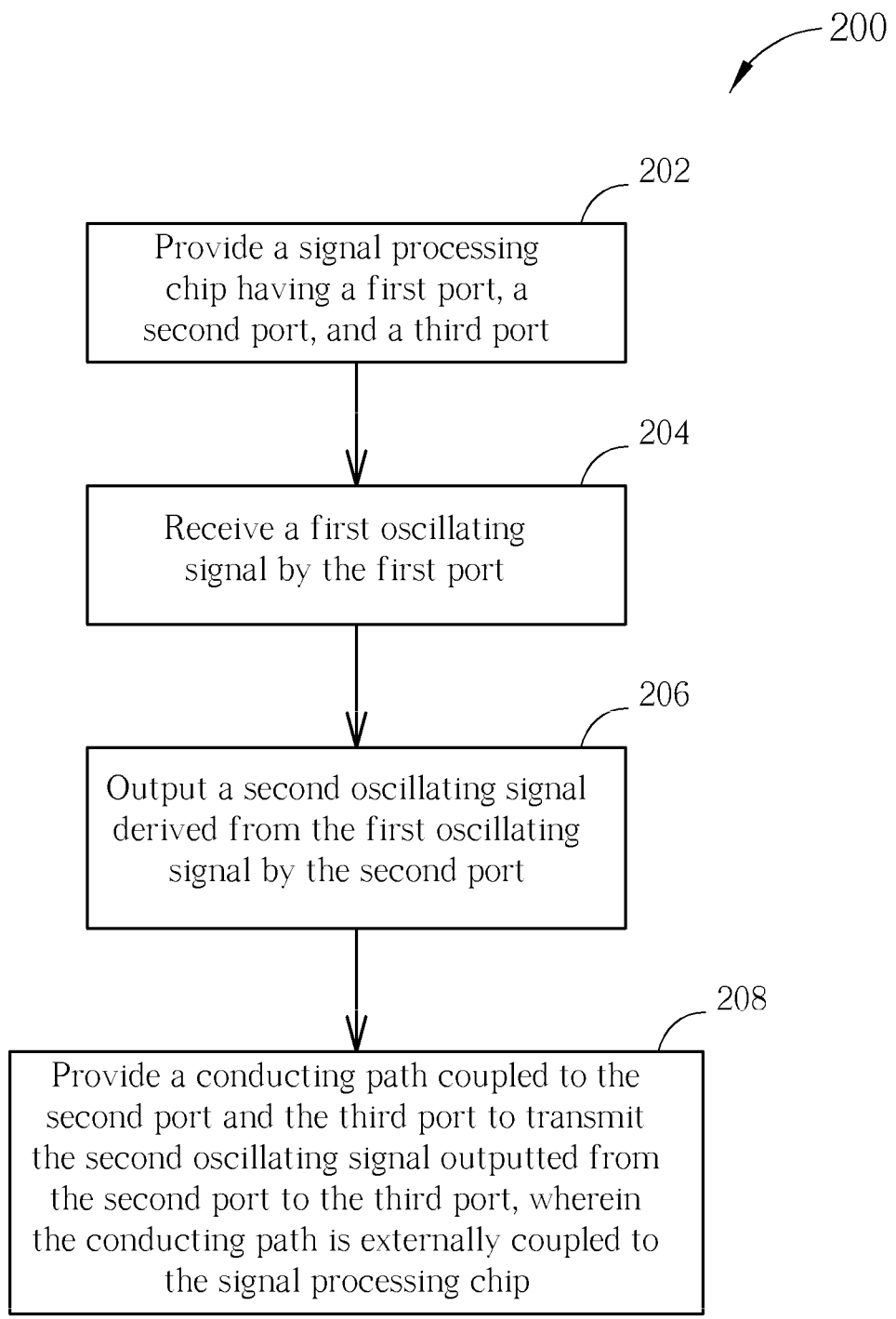
FIG. 2 is a flowchart illustrating a method for providing an oscillating signal in a signal processing device according to a second embodiment of the present invention.

A method for providing an oscillating signal in a signal processing device, such as the signal processing device 100 in FIG. 1, may be summarized in FIG. 2. FIG. 2 is a flowchart illustrating a method 200 for providing an oscillating signal (e.g. the second oscillating signal Sosc2) in a signal processing device (e.g. the signal processing device 100) according to a second embodiment of the present invention. The embodiment is illustrative only, the steps of the flowchart shown in FIG. 2 need not be in the exact order shown and need not be contiguous; that is, other steps can be intermediate. Besides, one or more steps in FIG. 2 can be omitted according to different design requirements. The method 200 includes the following steps:

Step 202: Provide a signal processing chip (e.g. the signal processing chip 102) having a first port (e.g. the first port 1022), a second port (e.g. the second port 1024), and a third port (e.g. the third port 1026);

Step 204: Receive a first oscillating signal (e.g. the first oscillating signal Sosc1) by the first port;

Step 206: Output a second oscillating signal (e.g. the second oscillating signal Sosc2) derived from the first oscillating signal by the second port; and Step 208: Provide a conducting path (e.g. the conducting path 104) coupled to the second port and the third port to transmit the second oscillating signal outputted from the second port to the third port, wherein the conducting path is externally coupled to the signal processing chip.

In step 204, the first oscillating signal can be generated/provided by a controllable oscillator (e.g. the controllable oscillator 106) according to a supply voltage, in which the controllable oscillator is not a crystal oscillator. In some embodiments, the controllable oscillator can be arranged to generate/provide the oscillating signal for an RF transceiver circuit, then the frequency (e.g. 26 MHz, 13 MHz, etc.) of the first oscillating signal may be higher than the required frequency (e.g. 32.768 KHz, etc.) of the real-time-clock block (e.g. a portion of or the entire operating circuit 1030) of the signal processing chip. Therefore, a frequency dividing operation can be performed upon the first oscillating signal with an oscillating frequency substantially equal to, for example, 26 MHz, to generate/provide the second oscillating signal with an oscillating frequency substantially equal to, for example, 32.768 KHz. After performing the frequency dividing operation upon the first oscillating signal to generate/provide the second oscillating signal, the second oscillating signal can further be outputted from the signal processing chip via the second port, and then be again input to the real-time-clock block via the conducting path and the third port (steps 206, 208). Accordingly, the conventional crystal oscillator can be omitted, and the BOM cost and PCB area of the signal processing device, such as the signal processing device 100, can be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing device, comprising:
   a controllable oscillator for generating a first oscillating signal;
   a radio-frequency transceiver circuit, coupled to the controllable oscillator, for receiving the first oscillating signal;
   a signal processing chip, comprising:
      a first port, coupled to the radio-frequency transceiver circuit, capable of receiving the first oscillating signal via the radio-frequency transceiver circuit;
      a second port, capable of outputting a second oscillating signal derived from the first oscillating signal; and
      a third port; and
   a conducting path, external to the signal processing chip and coupled to the second port and the third port, and capable of transmitting the second oscillating signal outputted from the second port to the third port.

2. The signal processing device of claim 1, wherein the second oscillating signal is a real-time clock of the signal processing device.

3. The signal processing device of claim 1, wherein an oscillating frequency of the first oscillating signal substantially equals 26 MHz.

4. The signal processing device of claim 1, wherein an oscillating frequency of the second oscillating signal substantially equals 32.768 KHz.

5. The signal processing device of claim 1, wherein the second port is a general purpose input/output (GPIO) pin.

6. The signal processing device of claim 1, wherein the signal processing chip comprises
   an operating circuit, coupled to the third port, and capable of receiving the second oscillating signal via the third port and using the received second oscillating signal as a real-time clock of the signal processing device.

7. The signal processing device of claim 6, wherein the signal processing chip further comprises:
   a fourth port, coupled to the operating circuit, wherein the third port and the fourth port form a crystal oscillator input port, and the fourth port is unused when the signal processing device is under an operation mode.

8. The signal processing device of claim 7, wherein the fourth port is an open circuit.

9. The signal processing device of claim 1, wherein the signal processing chip comprises:
   a frequency divider, coupled between the first port and the second port, and capable of dividing the first oscillating signal to provide the second oscillating signal.

10. A method for providing an oscillating signal in a signal processing device, comprising:
    generating a first oscillating signal by a controllable oscillator;
    receiving the first oscillating signal by a radio-frequency transceiver circuit;
    receiving the first oscillating signal by a first port of a signal processing chip via the radio-frequency transceiver circuit;
    outputting a second oscillating signal derived from the first oscillating signal by a second port of the signal processing chip; and
    receiving the second oscillating signal outputted from the second port to a third port via a conducting path;
    wherein the conducting path is externally coupled between the second port and the third port of the signal processing chip.

11. The method of claim 10, wherein the second oscillating signal is a real-time clock of the signal processing device.

12. The method of claim 10, wherein an oscillating frequency of the first oscillating signal substantially equals 26 MHz.

13. The method of claim 10, wherein an oscillating frequency of the second oscillating signal substantially equals 32.768 KHz.

14. The method of claim 10, wherein the second port is a general purpose input/output (GPIO) pin.

15. The method of claim 10, wherein the signal processing chip further comprises an operating circuit, and the method further comprises:
    receiving the second oscillating signal by the operating circuit via the third port; and
    using the received second oscillating signal as a real-time clock of the signal processing device by the operating circuit.

16. The method of claim 10, wherein the signal processing chip comprises a frequency divider, and the method further comprises:
    dividing the first oscillating signal to provide the second oscillating signal by the frequency divider.

* * * * *